United States Patent [19]
Radjy et al.

[11] Patent Number: 5,101,378
[45] Date of Patent: Mar. 31, 1992

[54] OPTIMIZED ELECTRICALLY ERASABLE CELL FOR MINIMUM READ DISTURB AND ASSOCIATED METHOD OF SENSING

[75] Inventors: Nader A. Radjy, San Francisco; Michael S. Briner, San Jose, both of Calif.

[73] Assignee: Advanced Micro Devices, Inc., Sunnyvale, Calif.

[21] Appl. No.: 604,824

[22] Filed: Oct. 26, 1990

Related U.S. Application Data

[62] Division of Ser. No. 207,323, Jun. 15, 1988, Pat. No. 5,005,155.

[51] Int. Cl.$^5$ .................. G11C 16/04; G11C 16/06
[52] U.S. Cl. ............................. 365/185; 365/189.09
[58] Field of Search ........... 365/104, 184, 185, 189.08, 365/189.09; 357/23.5; 307/465, 468

[56] References Cited

U.S. PATENT DOCUMENTS

| | | | |
|---|---|---|---|
| 4,402,064 | 8/1983 | Arakawa | 365/185 |
| 4,546,454 | 10/1985 | Gupta | 365/200 |
| 4,628,487 | 12/1986 | Smayling | 365/185 |
| 4,654,825 | 3/1987 | Riverson | 365/185 |
| 4,663,740 | 5/1987 | Ebel | 365/185 |
| 4,695,979 | 9/1987 | Tuvell et al. | 365/185 |
| 4,715,014 | 12/1987 | Tuvell et al. | 365/185 |
| 4,788,663 | 11/1988 | Tanaka et al. | 365/185 |
| 4,912,534 | 3/1990 | Tanaka | 365/185 |

FOREIGN PATENT DOCUMENTS 8605323 9/1986 World Int. Prop. O. .......... 365/185

OTHER PUBLICATIONS

Pathak et al., "A 25-ns 16K CMOS PROM Using a Four Transistor Cell and Differential Design Techniques", IEEE Jour. of Sol. St. Ccts., vol. SC-20, No. 5, Oct. 1985, pp. 964–970.

Pathak et al., "A 25-ns 16K CMOS PROM Using a Four Transistor Cell", IEEE ISSCC, Feb. 1985, pp. 162–163, 332.

Advanced Micro Devices, Inc., Am PAL22V10 Data Sheet, Oct. 1986.

*Primary Examiner*—Glenn Gossage
*Attorney, Agent, or Firm*—Fliesler, Dubb, Meyer & Lovejoy

[57] ABSTRACT

A non-volatile memory apparatus having a plurality of memory cells, each memory cell including a floating gate tunnel device (130) having a drain (134) and a floating gate read transistor (140) having a source (142) and a drain (144), the tunnel device and read transistor in each respective cell having a common floating gate (138, 148) and a common control gate (136, 146). The apparatus includes writing circuitry (102, 160) for writing desired charge levels to the floating gate of a cell to be written during a writing operation, sense circuitry (140, 150) for sensing the charge levels on the floating gate of a cell to be read during a sense operation, and circuitry for applying during the sense operation a predetermined reference voltage to the source of the read transistor in the cell to be read, and a predetermined sense mode drain voltage different from the reference voltage to the drain of the tunnel device in the cell to be read, independently of the voltage at the drain of the read transistor in the cell to be read.

11 Claims, 6 Drawing Sheets

| | PT | WDL | IT | WSL | CGL | V$_{SS}$ |
|---|---|---|---|---|---|---|
| PROGRAMMING MODE | | | | | | |
| ARRAY CHARGE | 0 | 0 | V$_{cc}$(-5v) | >V$_T$(V$_T$-½v) | V$_{pp}$(-15v) | 0 OR FLOAT |
| SELECTIVE DISCHARGE (SELECTED CELL) | 0 | V$_{pp}$ | >V$_T$ | V$_{pp}$+VT | 0 | 0 OR FLOAT |
| SELECTIVE DISCHARGE (UNSELECTED CELL) | 0 | DON'T CARE | >V$_T$ | 0 | 0 | 0 OR FLOAT |
| SENSE MODE | | | | | | |
| SELECTED | (Bias) V$_{PT}$(-2v) | V$_{cd}$(-½v) | V$_{cc}$ | V$_{cc}$ | V$_{cg}$ | 0 |
| UNSELECTED | V$_{PT}$ | V$_{cg}$ | 0 | V$_{cc}$ | V$_{cg}$ | 0 |

| | INPUT(WL) | CG | PT (BL) | $V_{SS}$ |
|---|---|---|---|---|
| WRITE MODE | | | | |
| ARRAY CHARGE | $>V_T (V_T \sim 1v)$ | $V_{PP} (\sim 15v)$ | 0 | 0 OR FLOAT |
| SELECTIVE DISCHARGE (SELECTED CELL) | $V_{PP} + V_T$ | 0 | $V_{PP}$ | FLOAT |
| SELECTIVE DISCHARGE (UNSELECTED CELL) | 0 | 0 | DON'T CARE | FLOAT |
| SENSE MODE | | | (Bias) | |
| SELECTED | $V_{cc} (\sim 5v)$ | $V_{cg} (\sim 1v)$ | $V_{PT} (\sim 2v)$ | 0 |
| UNSELECTED | 0 | $V_{cg}$ | $V_{PT}$ | 0 |

FIGURE 5

| PROGRAMMING MODE | PT | WDL | IT | WSL | CGL | VSS |
|---|---|---|---|---|---|---|
| ARRAY CHARGE | 0 | 0 | $V_{cc}(\sim 5v)$ | $>V_T(V_T\sim 1v)$ | $V_{PP}(\sim 15v)$ | 0 OR FLOAT |
| SELECTIVE DISCHARGE (SELECTED CELL) | 0 | $V_{PP}$ | $>V_T$ | $V_{PP}+V_T$ | 0 | 0 OR FLOAT |
| SELECTIVE DISCHARGE (UNSELECTED CELL) | 0 | DON'T CARE | $>V_T$ | 0 | 0 | 0 OR FLOAT |

| SENSE MODE | PT | WDL | IT | WSL | CGL | VSS |
|---|---|---|---|---|---|---|
| SELECTED | (Bias) $V_{PT}(\sim 2v)$ | $V_{cg}(\sim 1v)$ | $V_{cc}$ | $V_{cc}$ | $V_{cg}$ | 0 |
| UNSELECTED | $V_{PT}$ | $V_{cg}$ | 0 | $V_{cc}$ | $V_{cg}$ | 0 |

OPTIMIZED ELECTRICALLY ERASABLE CELL FOR MINIMUM READ DISTURB AND ASSOCIATED METHOD OF SENSING

This application is a division of U.S. patent application Ser. No. 207,323, filed June 15, 1988, now U.S. Pat. No. 5,005,155.

RELATED APPLICATION

This Application is related to U.S. patent application Ser. No. 095,315, entitled "IMPROVED EEPROM CELL AND METHOD OF FABRICATION," filed Sept. 10, 1987 on behalf of Y. Liu, N. Radjy and S. Cagina, now abandoned, which is a continuation-in-part of U.S. patent application Ser. No. 738,919, filed May 29, 1985 , also now abandoned, and is also related to U.S. patent application Ser. No. 07/351,011, filed June 16, 1989, now U.S. Pat. No. 4,935,648. Both of the above Applications are hereby incorporated by reference in their entirety herein.

BACKGROUND OF THE INVENTION

1. Field of the Invention

The present invention relates to electrically erasable programmable memory cells, and more particularly to such cells as optimized for use in programmable logic devices.

2. Description of Related Art

A typical programmable logic array (PLA), which is a type of programmable logic device, incorporates a plurality of input terms feeding a programmable AND array, the output of which feeds either a fixed or programmable OR array. The output of the OR array may or may not pass through output circuitry before being made available to external package pins. The outputs of the AND array constitute product terms, and the array is programmable to select which of the inputs are ANDed together to form each of the product terms. A typical device which incorporates the above elements is the AmPAL22V10, described in the data sheet therefor published in October 1986. It should be noted that due to the laws of Boolean algebra, any AND array may be viewed equally as an OR array, and vice versa, and either or both in combination may be implemented in other forms in a combinatorial logic array.

Programmable cells for use in programmable logic devices are typically arranged into words, each word representing an input term and each row of cells in corresponding positions in different words representing a product term. Each cell has two states: one in which the input associated with the cell acts on the product term and one in which it does not. All inputs whose cells are programmed to act on a product term are wire-ANDed together to generate the resulting product term signal.

Cells are typically programmable by the user either by burning selected fuses, or by electrically programming a floating gate of a MOS transistor. It has been found particularly advantageous to use floating gate MOS transistors, made programmable and erasable through the use of Fowler-Nordheim tunnelling. The resulting programmable logic device is often called an EEPLD (Electrically Erasable and Programmable Logic Device).

A typical cell for use in an EEPLD is shown in FIG. 1. It includes a floating gate tunnel device 10, and floating gate read transistor 12, and a select transistor 14. The floating gate tunnel device 10 and the floating gate read transistor 12 have a common control gate 16, and a common floating gate 18 located physically beneath the control gate 16. The drain region of the floating gate tunnel device 10 is connected to a node 20, which is also connected to the drain of the floating gate read transistor 12 and to the source of select transistor 14. The source of floating gate read transistor 12 is connected to $V_{ss}$, and the source of floating gate tunnel device 10 is left unconnected. Because the capacitive effects of the tunnel devices are so important in these cells, as hereinafter described, the tunnel devices are sometimes referred to herein as "tunnel capacitors".

Floating gate tunnel capacitor 10 includes a tunnel dielectric between the floating gate 18 and the substrate. This tunnel dielectric is made extremely thin in order to permit tunnelling of electrons between the substrate and the floating gate under the influence of the net electric field across the tunnel oxide. It should be noted that though the connected region of floating gate tunnel capacitor 10 is referred to herein as the drain, the interchangeability between drain and source in FET's renders it equally valid to refer to this region as the source of the floating gate tunnel capacitor 10.

When the cell shown in FIG. 1 is placed in an AND array, the drains of all the select transistors 14 in a row are connected together to form a product term (PT). The gates of all the select transistors 14 in a word are connected together to form an input term (IT). In memory technology, product terms become bit lines (BL) and input terms become word lines (WL). Similarly the control gates 16 for all the cells in the AND array are connected to form a word control gate line (CG).

The operation of the cell of FIG. 1 for writing and sensing operations is summarized in the table of FIG. 2. The write mode typically encompasses both a global charging ("programming") step followed by a selective discharge ("selective erasure"). To charge the entire array, the input terms 24 for all words in the array are raised to a voltage greater than the $V_T$ of select transistor 14. This enables conduction between the product term 22 and the nodes 20 in each cell. The control gates 16 for all cells are then raised to a high voltage $V_{pp}$, and the product terms 22 are held at ground. $V_{ss}$ may be left floating or held at ground potential. In this way a net electric field is created across the tunnel dielectric in the floating gate tunnel capacitors and charge is drawn from the drains of the tunnel capacitors to the floating gates.

Selective discharge is typically accomplished one word at a time. First the IT 24 for the selected word is brought to $V_{pp}+V_T$ and the control gate lines 16 are held at ground. Then only the selected ones of the PT's 22 are brought to $V_{pp}$. The high voltage on the input term 24 causes the drain voltage $V_d$ of the tunnel capacitors 10 in the word to track the corresponding PT voltage, so only those cells in the selected word which have $V_{pp}$ on their PT 22 will have a net electric field tending to discharge electrons from the floating gate to the drain of tunnel capacitor 10. $V_{ss}$ typically floats during selective discharge.

For words which are unselected during the selective discharge operation, the input term 24 is held at ground to isolate the floating gate tunnel capacitors from product terms 22, which may be at $V_{pp}$ for discharging other cells connected to the product term. Since the floating gate tunnel device is isolated from the product term line, any voltage on the product term line will not affect the existing charge on the cell (see "don't care" in the table of FIG. 2).

When operating in the read or sense mode, each word is either selected or unselected. If a word is selected (i.e., the input term for that word is high), $V_{cc}$ is provided to the gate of the select transistor 14. This connects the node 20 to the product term (bit line) 22. The control gate 16 of the cell is held at a read potential $V_{cg}$, for example at 1 volt, so that if the common floating gate 18 of the floating gate tunnel capacitor 10 and floating gate read transistor 12 is charged, the read potential is insufficient to overcome the floating gate charge to generate a channel between the source and drain of floating gate read transistor 12. Floating gate read transistor 12 therefore remains off, and the cell has no effect on the voltage of the bit line 22. If the floating gate 18 is discharged, then the read potential is sufficient to generate a channel between the source and drain of floating gate read transistor 12. Assuming $V_{ss}$ is held at ground potential during the read operation, the bit line 22 will be pulled from its bias potential of $V_{PT}$ (2 volts, for example) toward ground.

If the cell is unselected (i.e., the input term is at a logic zero level), then the gate of select transistor 14 will be held at 0 volts and the charge stored on the floating gate 18 for the cell will have no effect on the voltage of the product term 22. Thus, in the read mode, only those cells which are connected to the product term 22 and which have discharged floating gates 18 can pull the product term low. Those cells will do so if and only if the input term associated with any one of those cells is high. The product term therefore carries the product of all the input values associated with cells on the product term which have discharged floating gates.

All electrically erasable devices which store charge on a floating gate suffer from potential charge loss over a long period of time due to undesired tunnelling through the tunnel dielectric. Manufacturers usually specify data retention limits at ten (10) years, undesired tunnelling being one of the primary causes of data loss. If the device is unpowered, gradual loss of charge is continuous due to the potential difference between the floating gate 18 and the drain of the floating gate tunnel capacitor 10. If a device is powered, the field across the tunnel dielectric depends in part on the voltage difference between the control gate 16 and drain of floating gate tunnel capacitor 10. In theory this field could be minimized by maintaining an appropriate voltage on the control gate 16. That solution is not satisfactory, however, due to the connection of the drain of floating gate tunnel capacitor 10 to the node 20. The voltage on node 20 changes depending on the voltage level on the product term 22, on the state of charge on the floating gate 10, and on whether or not the cell is selected for read (the state of the input term 24). Since it is not very practical to include circuitry within every cell to adjust the control gate voltage according to all these conditions, typically an intermediate value for $V_{cg}$ is chosen and gradual charge loss is tolerated.

The problem exists in EEPROMs too, but it is much worse in EEPLDs for two reasons. First, note that read disturb is most severe when a cell is selected since the voltage $V_d$ will typically be at least about one volt above or below $V_{cg}$, depending on the product term voltage. This may be tolerable in an EEPROM, since only one cell on each product term (bit line) is selected at a time. In an EEPLD, however, each input term has a corresponding input term. At all times, therefore, about half the cells in the array are selected. The probability that a given cell will be selected at any given time is therefore much greater in an EEPLD, making the potential for read disturb correspondingly greater.

Secondly, the nature of EEPROMs is such that they will be re-programmed much more frequently than will electrically erasable programmable logic devices. Typically EEPROMs are specified for 100 times the number of writes as EEPLDs. Since the data retention period begins anew each time the array is reprogrammed, the data retention period is much less likely to play an important role toward the end of the lifetime specified for an EEPROM than for an EEPLD.

U.S. Pat. No. 4,546,454 to Gupta discloses at FIG. 3 an electrically erasable programmable memory cell circuit for use as an enabling element for a redundant row or column of memory cells in a semiconductor memory array. While the Gupta cell may alleviate some of the problems of other prior art cells, it does not solve them completely. For example, during read mode, there is no access to the control gates of unselected cells since the transistors 214 are turned off. Control of the field across the tunnel dielectric is therefore not permitted when a cell is unselected.

It is therefore an object of the present invention to provide an electrically erasable memory cell which alleviates the above problems.

It is another object of the present invention to provide an electrically erasable programmable cell which minimizes read disturb.

It is another object of the present invention to provide an electrically erasable programmable cell which minimizes the potential across the tunnel dielectric in the worst case during the read mode.

It is another object of the present invention to provide an EEPLD having programmable cells with minimized read disturb.

SUMMARY OF THE INVENTION

In one aspect of the invention, the above objects and others are accomplished by disconnecting the drain of the floating gate tunnel capacitor from the source of the select transistor and maintaining it at a constant voltage at all times while the device is in the sense mode. Advantageously, the drain of the tunnel capacitor may be kept at the same voltage as the control gate. This can be accomplished by providing a separate write select transistor in each cell, separating the function of the input term into an input term (IT) for read selection and a write select line (WSL) for write selection, and separating the function of the product term into a product term (PT) for sensing and a write data line (WDL) for writing. WSL and WDL are used while the device is in the sense mode to apply the same voltage to the drain as is applied to the control gate of the capacitor. Analysis shows that this significantly reduces the worst-case net electric field across the tunnel dielectric over the life of the product.

In another aspect of the invention there is provided a 4-device cell, including a floating gate tunnel capacitor and a floating gate read transistor as in the prior art cell, a read select transistor instead of the select transistor of the prior art cell, and further including a write select transistor. The source of the floating gate read transistor is connected to a $V_{ss}$ potential, and the drain is connected to the source of the read select transistor. The drain of the read select transistor is connected to a product term which may be connected to corresponding nodes in corresponding cells in different words. The gate of the read select transistor is connected to an input term which is common to other cells in the word. Like the cell of FIG. 1, the source of the floating gate tunnel capacitor is left unconnected, but unlike the cell of FIG. 1, the drain of the tunnel capacitor is not connected to the junction between the floating gate read transistor and the read select transistor. It is instead connected to the source of the write select transistor, the drain of which is connected to a write data line which is common to corresponding cells in different words of the array. The gate of the write select transistor is connected to a write select line which is common to other cells in the word.

BRIEF DESCRIPTION OF THE DRAWINGS

The invention will be described with respect to specific embodiments thereof. Other objects, embodiments and features of the invention will be apparent from a reading of the detailed description in conjunction with the drawings, in which:

FIG. 5 is a table showing typical bias voltages for use with the cell shown in FIG. 4;

DETAILED DESCRIPTION

Figure 3:
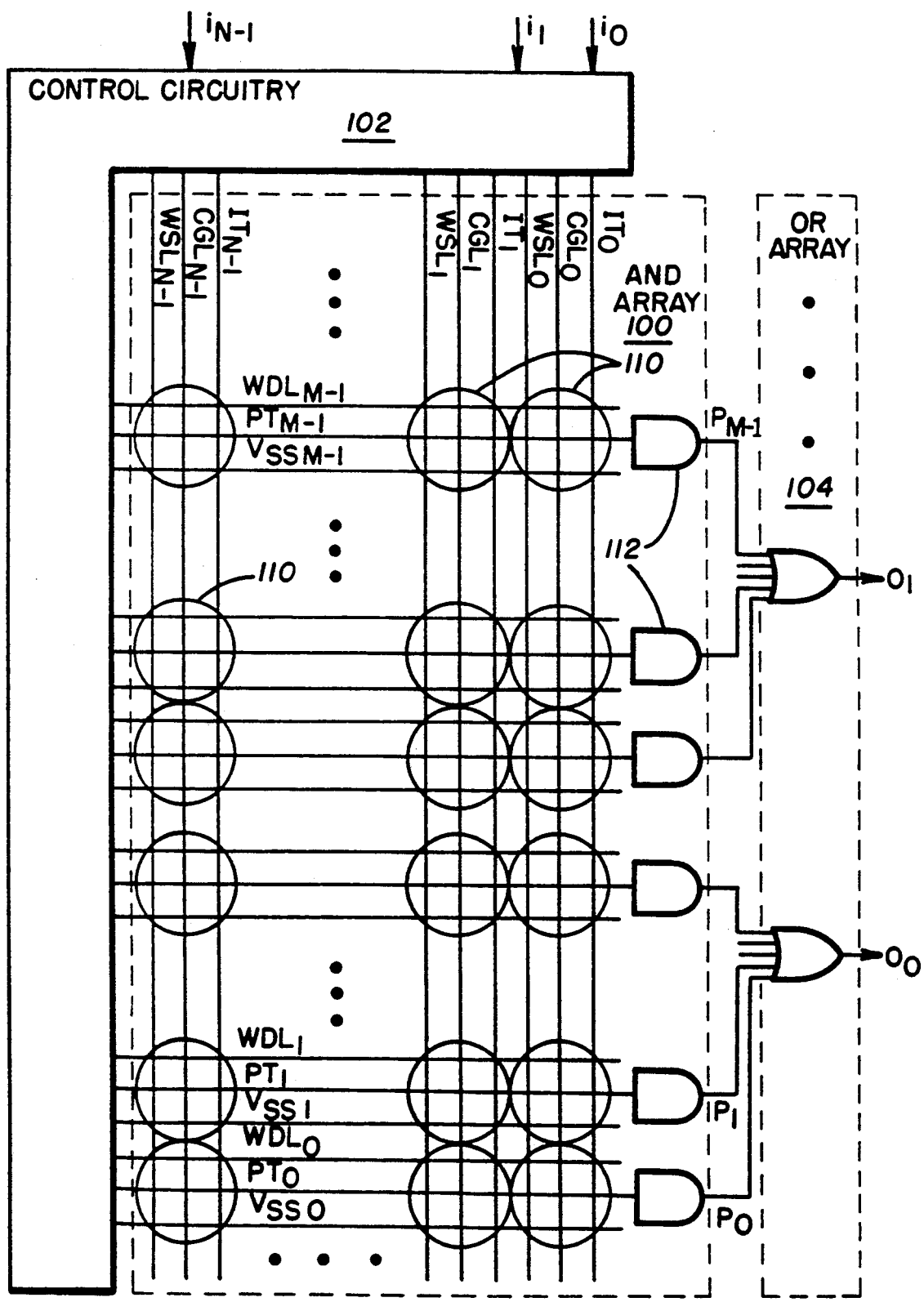
FIG. 3 shows an electrically erasable programmable logic device in which the invention may be implemented.

Shown in FIG. 3 is a typical EEPLD architecture for PLA applications incorporating the present invention. It includes an AND array 100 having a plurality of lines controlled by control circuitry 102. The control circuitry 102 has N input pins, labeled $i_O$ through $i_{N-1}$, and the AND array 100 has M product outputs, labeled $P_O$ through $P_{M-1}$. The product outputs $P_O$-$P_{M-1}$ are fed to inputs of an OR array 104, the outputs of which constitute outputs of the EEPLD. Though the illustration in FIG. 3 shows the OR gates in OR array 104 having inputs connected to fixed subsets of the product outputs $P_O$-$P_{M-1}$, it will be understood that the selection of these subsets may be made programmable themselves, by means which may or may not themselves incorporate the present invention. Similarly, the outputs of OR array 104 may be further connected to output circuitry incorporating registers or programmable output logic macro cells, not shown, and may or may not include feedback paths to the input pins $i_O$-$i_{N-1}$.

AND array 100 comprises an array of cells 110, shown as circles in FIG. 3. These cells are arranged into N words of M cells each, each word being shown as a vertical column in the drawing of FIG. 3. Corresponding cells in the different words are arranged in a horizontal row. Though the organization of the AND array 100 may be referred to herein according to rows and columns, it will be understood that words of cells need not be organized physically as such as long as logical words are maintained.

Three different lines are connected to all the cells in each word. These lines are referred to as an input term (IT), a write select line (WSL), and a control gate line (CGL). Similarly, three different lines are connected to all the cells in each corresponding position of all the words. These lines are referred to herein as the write data line (WDL), the product term (PT), and a source potential $V_{ss}$.

The purpose of these six lines will be explained in more detail below in connection with the detailed description of a cell embodiment. At this point, however, it is worthwhile nothing that the control circuitry 102 can operate the AND array in either a sense mode or a write mode. In the sense mode, the input terms (IT) carry signals corresponding to the input signals on $i_O$-$i_{N-1}$ and the product terms (PT) carry the product terms. In the write mode, the write select lines (WSL) carry signals indicating which word or words are to be written, while the write data lines (WDL) and control gate lines CGL carry the necessary charging or discharging potentials.

The product terms (PT) are each connected to the input of a sense amplifier 112, the outputs of which constitute the $P_O$-$P_{M-1}$ outputs of AND array 100. It should be noted that the diagram of FIG. 3 is only illustrative, it being intended only to provide a context in which the inventive cell may be used.

Figure 4:
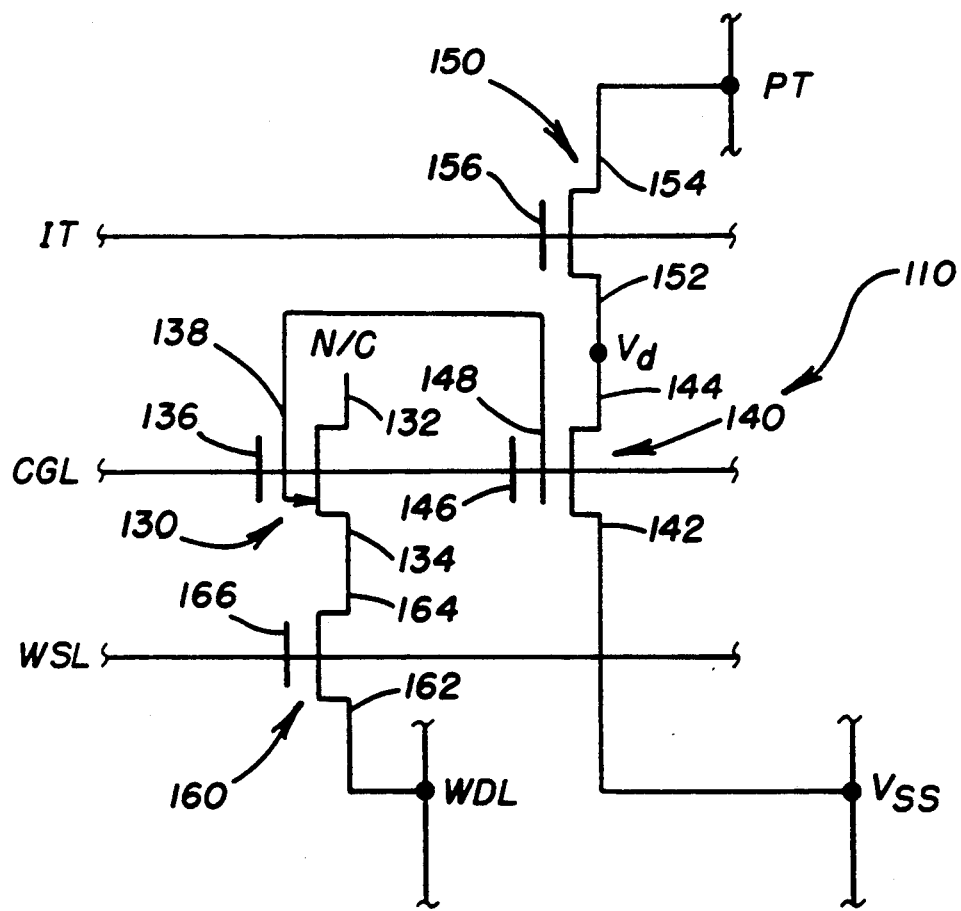
FIG. 4 schematically shows a cell constructed according to the invention.

In FIG. 4 there is shown a cell 110 according to the invention. It comprises a floating gate tunnel capacitor 130 having a source 132, a drain 134, a control gate 136 and a floating gate 138. A floating gate read transistor 140 is also provided, having a source 142, a drain 144, a control gate 146 and a floating gate 148. The floating gate 148 of the floating gate read transistor 140 is connected to the floating gate 138 of the floating gate tunnel capacitor 130, and the control gate 146 of the floating gate read transistor 140 is connected to the control gate 136 of the floating gate tunnel capacitor 130. The two control gates 136 and 146 are also connected to the control gate line CGL for the cell.

Connected to the drain 144 of the floating gate read transistor 140 is the source 152 of a read select transistor 150. A drain 154 of the read select transistor 150 is connected to the product term for the cell, and a gate 156 of the read select transistor 150 is connected to the input term IT for the cell. Connected to the drain 134 of floating gate tunnel capacitor 130 is the source 164 of a write select transistor 160. A drain 162 of the write select transistor 160 is connected to the write data line for the cell, and a gate 166 of the write select transistor 160 is connected to the write select line for the cell. The source 142 of floating gate read transistor 140 is connected to the $V_{ss}$ line for the cell, and the source 132 of floating gate tunnel capacitor 130 is left unconnected.

FIG. 5 is a table showing typical potentials for operating the cell of FIG. 4. As in the conventional cell, data is written into the array first by charging all the cells in the array and then discharging selected cells, word by word. The global charge is accomplished by raising all the control gate lines CGL to $V_{pp}$ while the drains 134 of all of the floating gate tunnel capacitors 130 are held at ground. The drains 134 are held at ground by holding all the write data lines WDL at ground and raising the write select lines WSL for all cells to some potential above the $V_T$ of the write select transistor 160.

During this time, the $V_{ss}$ and product term lines PT are held at ground while the input terms IT are raised to $V_{cc}$. Alternatively during this time, the product terms can be raised to some voltage and the input terms raised to a voltage at least one $V_T$ higher, so that the coupling from drain 144 of floating gate read transistor 140 to the floating gate 148 can help increase the charging field across the tunnel dielectric in the capacitor 130. $V_{ss}$ should float if the latter alternative is used so as to prevent large current flow through the read select transistor 150 and the floating gate read transistor 140. In another alternative during this time, $V_{ss}$ may be raised to some potential to increase the charging field while the input terms are held at ground level to prevent large current flow.

Selective discharge is accomplished one word at a time. The control gate lines CGL for all cells are brought to ground, while the drains 134 of the floating gate tunnel capacitors 130 for only the selected cells in the selected words are raised to $V_{pp}$. The latter function is accomplished by raising the write select line WSL for the selected word to $V_{pp}$ plus one $V_T$ for the write select transistor, and by raising the WDL for the selected cells to $V_{pp}$. Any cell whose write select line is at ground (in which case the voltage on the WDL is a don't care), or whose write select line is at $V_{pp}+V_T$ but whose write data line is at ground, is unselected and not discharged.

All product terms are kept at 0 V during selective discharge, and all input terms kept at least one $V_T$ (of read select transistor 150) above ground. $V_{ss}$ may be at ground or floating. Typically, the programming potential $V_{pp}$ may be between 13 and 20 volts depending on the technology used, and $V_T$ is approximately 1 volt.

Several variations of the above typical programming potentials are possible. For example, since the purpose of placing a high voltage on the write select line is only to provide a conduction path between the drain 134 of the floating gate tunnel capacitor 130 and the write data line, it can be seen that if the cell is to be charged (with WDL=0 volts), then the write select line need be brought only to $V_T$. An intermediate value between $V_T$ and $V_{pp}$, such as $V_{cc}$, would also suffice.

Figures 1, 2:
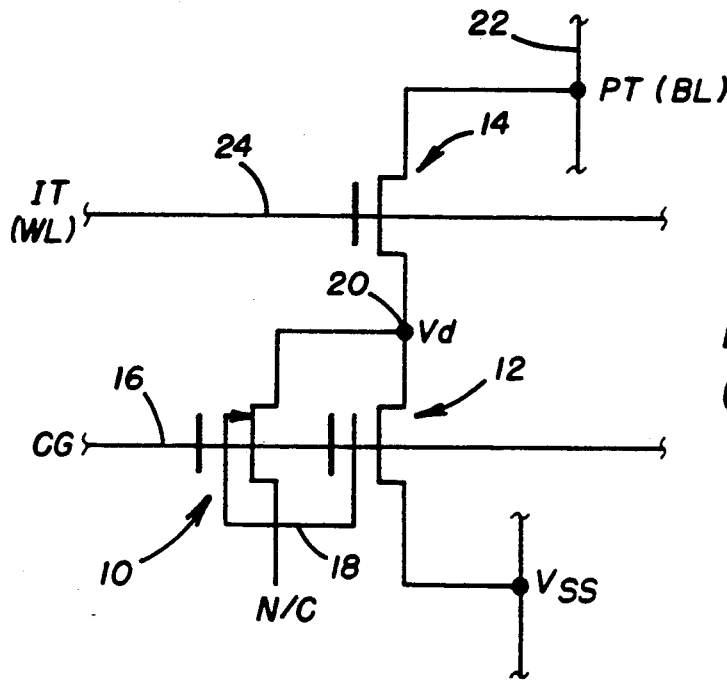
FIG. 1 schematically shows a prior art cell.
FIG. 2 is a table showing typical bias voltages for use with the cell shown in FIG. 1.

It should be noted that unlike the conventional cell shown in FIG. 1, the cell of FIG. 4 includes two separate cell data lines PT and WDL. In this approach, therefore, no high programming voltages $V_{pp}$ need be applied to the read select transistor 150 or to the floating gate read transistor 110. Consequently, the channel lengths of these devices can be made shorter thus reducing read product term capacitance, increasing cell current gain and substantially improving the circuit's speed performance.

Referring again to the table of FIG. 5, typical potentials for using the cell of FIG. 4 in the sense mode will now be described. The device will spend most of its life in the sense mode, so it is here where charge loss from or gain to the floating gate must be minimized.

When the device is in the sense mode, the product terms are all biased initially at a bias voltage $V_{PT}$. In a 5-volt device, $V_{PT}$ may be approximately 2 volts. Additionally, all the control gate lines CGL are held at a read voltage $V_{cg}$, chosen to be at a value between the charged and discharged threshold values ($V_{Tc}$ and $V_{Td}$, respectively) of the floating gate read transistor 140. A higher $V_{cg}$ (closer to $V_{Tc}$) yields a stronger gate drive, thereby permitting a larger current flow on sense. On the other hand, a higher $V_{cg}$ also reduces the margin for process variations and for charge loss. Advantageously, as explained in more detail below, the floating gate read transistor 140 may be a near intrinsic transistor, in which case $V_{cg}$ may be approximately 1 volt.

To complete the sense operation, the $V_{ss}$ lines for all cells are brought to ground while the input term for only the selected cells (i.e., all "input" terms) are brought to $V_{cc}$. The remainder of the input terms (i.e., all "input" terms) are held at 0 volts. Therefore, in order for a particular cell to pull its product term toward ground, channels must be induced in both the read select transistor 150 and the floating gate read transistor 140. This cannot happen if the floating gate 138, 148 in the cell is charged, and the read potential $V_{cg}$ is less than the threshold voltage $V_{Tc}$ for a charged transistor. If the floating gate 138, 148 is discharged, however, the read voltage $V_{cg}$ will provide added gate drive to potential already existing on the floating gate and a channel will exist between the source and drain of floating gate read transistor 140. In this situation, whether the PT is pulled low depends almost entirely on the voltage of the input term (i.e., the input signal). That is, if the input signal is high, PT will be pulled low. If the input term IT is low, the cell will have no effect on PT.

Since the write data line is not needed for the sense operation, it is available to help control the voltage potentials on the floating gate tunnel capacitor 130. According to the invention, while the device is in the sense mode, all the write data lines WDL are kept at a constant voltage $V_{WDL}$. That potential is transmitted to the drain 134 of floating gate tunnel capacitor 130 through a channel created under write select transistor 160 by keeping the write select line at at least $V_{WDL}$ plus one $V_T$ of the program select transistor 160. Advantageously, $V_{WDL}=V_{cg}$, and for convenience the write select line WSL is kept at $V_{cc}$. The drain 134 and control gate 136 of the floating gate tunnel capacitor 130 are thereby maintained at the same voltage and, as is shown below, this reduces the worst-case net electric field across the tunnel dielectric.

It can be seen that in the writing and sensing operations described herein, all the control gate lines CGL at any given time are at the same voltage. In a preferred embodiment, therefore, all of the control gate lines are permanently connected together with a metal interconnect.

As previously mentioned, it is advantageous but not essential that the floating gate read transistor 140 be a substantially intrinsic transistor. This permits fabrication of a device with one fewer masking step, since no depletion or enchancement implant is required. The only channel doping which causes this transistor to differ from a truly intrinsic transistor is the light doping, usually p-type, provided in the bulk substrate. Additionally, for a substantially intrinsic floating gate transistor, the charged and discharged threshold values $V_{Tc}$ and $V_{Td}$ will form a window centered approximately about zero (0) volts. This permits using a control gate read voltage $V_{cg}$ of no more than about 1 volt, thereby minimizing the long-term stress on the tunnel dielectric layer. Formation of the thin tunnel dielectric is a difficult step in the manufacturing process, and a reduction in long-term stress here permits a greater margin for processing. If the floating gate read transistor 140 does have some channel doping, the values of $V_{cg}$ and $V_{WDL}$ are altered accordingly.

Figure 6A:
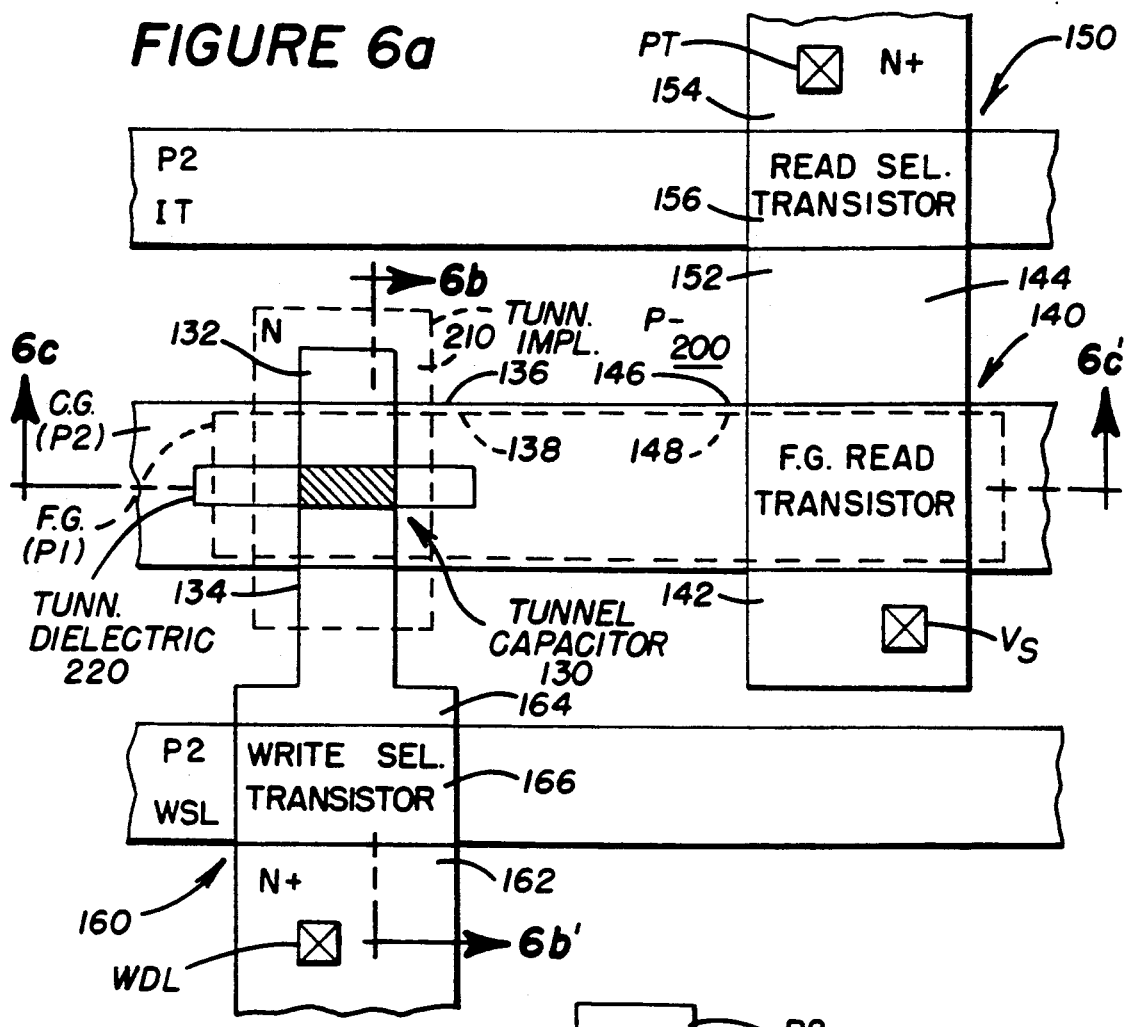
FIG. 6a shows a plan view of a layout which may be used to fabricate the cell shown in FIG. 4.
Figure 6B:
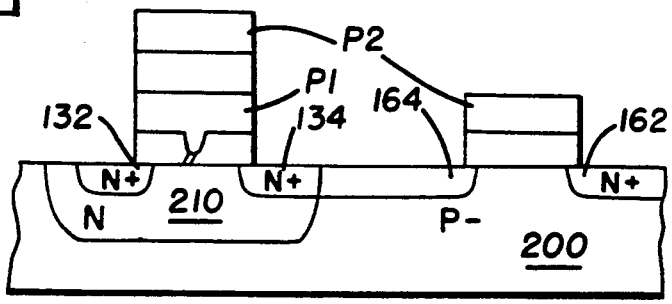
FIGS. 6b and 6c are cross-sectional views of the layout of FIG. 6a, taken along, respectively, planes b—b' and c—c'.
Figure 6C:
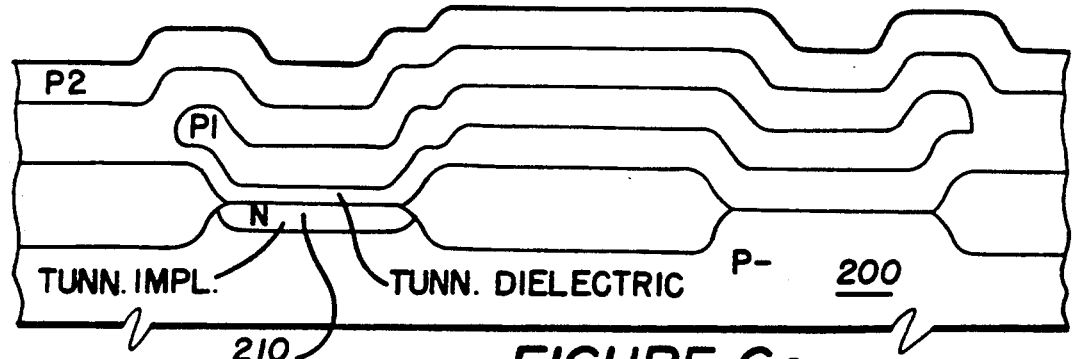

FIG. 6a shows a plan view of a cell manufactured according to the invention. FIG. 6b is a cross section taken from plane b—b', and FIG. 6c is a cross section taken from plane c—c'. The device may be fabricated in any known manner, but the method set forth in the related application is preferred.

As fabricated, the read select transistor 150 is formed with N+ drain and source regions 154 and 152, respectively, under a select gate 156 formed with a poly-2 layer. Similarly, write select transistor 160 is formed with N+ drain and source regions 162 and 164, respectively, formed under a poly-2 select gate 166. Floating gate read transistor 140 consists of N+ source and drain regions 142 and 144, respectively, the N+ region forming the drain 144 of the floating gate read transistor 140 being common with the N+ region forming the source 152 of read select transistor 150. The tunnel capacitor 130 includes N+ source and drain regions 132 and 134, an N-doped tunnel implant region 210, and a gate structure. The gate structure comprises a first dielectric layer (not shown specifically) having a thin tunnel dielectric region 220, floating gate 138 formed in a poly-1 layer, an interpoly dielectric (not shown) and a control gate 136 formed in the poly-2 layer. The poly-1 and poly-2 layers forming respectively the floating gate 138 and control gate 136 of the tunnel capacitor 130 extend across to the floating gate read transistor to form, respectively, the floating gate 148 and control gate 146 thereof. The N+ region forming drain 134 of tunnel capacitor 130 is the same as the N+ region forming source 164 of the write select transistor 160.

The tunnel capacitor/floating gate read transistor combination shown in FIG. 4 may be fabricated using the same technology, dimensions and doping levels as the tunnel capacitor/floating gate read transistor shown in FIG. 1. Assuming that is done, the improvement made possible by the invention may be quantified using a simplified analysis set forth below. For the purposes of this analysis, the following capacitances are defined (CG=control gate; FG=floating gate):

$C_g$ = CG to FG capacitance
$C_{tunn}$ = tunnel region drain to FG capacitance
$C_{ch}$ = read transistor channel to FG capacitance
$C_{subs}$ = substrate to FG capacitance.

Since the capacitor forming $C_{subs}$ crosses the thick field oxide between the tunnel capacitor and the floating gate read transistor, $C_{subs}$ is small and may be ignored in this first order calculation.

The following coupling coefficients are also defined:

CG to FG coupling:
$$\alpha_g = \frac{C_g}{C_g + C_{tunn} + C_{ch}}$$

Tunnel region drain to FG coupling:
$$\alpha_{tunn} = \frac{C_{tunn}}{C_g + C_{tunn} + C_{ch}}$$

Read transistor channel to FG coupling:
$$\alpha_{ch} = \frac{C_{ch}}{C_g + C_{tunn} + C_{ch}}$$

It should be noted that $C_{ch}$ is larger when the floating gate read transistor is on than when it is off. This is because when the transistor is on, the depletion region extends all the way from source to drain. The capacitor is therefore formed between the floating gate and the entire channel. When the transistor is off, the depletion region is much smaller. The capacitor is therefore formed over a significantly smaller area. The coupling ratio $\alpha_{ch}$ is therefore larger for an "on" transistor than for an "off" transistor. The other coupling ratios $\alpha_g$ and $\alpha_{tunn}$ also depend on the state of the floating gate read transistor, but by a much smaller amount since the denominator of the fractions defining these quantities is much larger than the range by which $C_{ch}$ varies.

Using the above definitions, the following voltages are present on the floating gate in the conventional cell of FIG. 1 during sensing. The floating gate read transistor is assumed to have an intrinsic threshold (with no charge on the floating gate) of $V_{T0} \approx 0$. The charged threshold value $V_{Tc}$ is therefore greater than zero and the discharged threshold value $V_{Td}$ is less than zero.

Conventional cell, discharged state, threshold = $V_{Td}$:  (a)
$V_F = \alpha_g V_{T0} + \alpha_g V_{cg} + V_d(\alpha_{tunn} + \alpha_{ch}) + \alpha_g |V_{Td}|$
Conventional cell, charged state, threshold = $V_{Tc}$:  (b)
$V_F = \alpha_g V_{T0} + \alpha_g V_{cg} + V_d(\alpha_{tunn} + \alpha_{ch}) - \alpha_g V_{Tc}$ Note that as previously explained, $V_d$ varies in this conventional cell depending on whether or not the cell is selected (IT=$V_{cc}$, for example) and whether or not another cell connected to the product term is pulling it down. Typically $V_d$ ranges between 0 and 2 volts.

Similarly, the following voltages are present on the floating gate in the cell of FIG. 4 during sensing. The floating gate read transistor 140 is again assumed to have an intrinsic threshold voltage of $V_{T0} \approx 0$. As previously explained, in accordance with the table of FIG. 5, WDL and hence the drain 134 of the floating gate tunnel capacitor 130 is assumed for the purposes of this illustration to have a voltage equal to the read voltage ($V_{cg}$) on the control gate line.

Inventive cell, discharge state, threshold = $V_{Td}$:  (c)
$V_F = \alpha_g V_{T0} + \alpha_g V_{cg} + \alpha_{tunn} V_{cg} + \alpha_{ch} V_d + (\alpha_g + \alpha_{tunn}) |V_{Td}|$
Inventive cell, charged state, threshold = $V_{Tc}$:  (d)
$V_F = \alpha_g V_{T0} + \alpha_g V_{cg} + \alpha_{tunn} V_{cg} + \alpha_{ch} V_d + (\alpha_g + \alpha_{tunn})(-V_{Tc})$ $V_d$ varies in the inventive cell to the same extent that it varies in the conventional cell, but the differences in the equations render the effect on $V_F$ slight.

Illustratively, for a competitive technology, the following process parameters may be used to fabricate either the conventional or inventive cell:

CG/FG common area = 56 $\mu m^2$
Effective tunnel dielectric area = 1.4 $\mu m^2$
Effective tunnel capacitor area (less tunnel dielectric area) = 2.2 $\mu m^2$
FG read transistor: FG/effective transistor area = 5.92 $\mu m^2$
FG read transistor effective channel width = 3.7 $\mu m$
Tunnel dielectric thickness = 80 Å
FG to substrate gate oxide thickness = 295 Å
CG to FG interpoly dielectric equivalent oxide thickness = 420 Å

The above parameters yield the following coupling coefficients:

$\alpha_g$ = 74.6%

$\alpha_{tunn}$ = 14.0%

$\alpha_{ch}$ = 1.4% (charged cell)

$\alpha_{ch}$ = 5.3% (discharged cell)

Inserting these values into the equations above for $V_F$, and subtracting the voltage of the drain of the tunnel capacitor ($V_d$ for the conventional cell and $V_{cg}$ for the inventive cell), equations may be obtained for the voltage $\Delta V_{TunnOx}$ across the tunnel dielectric as a function of the charged and discharged threshold voltages $V_{Tc}$ and $|V_{Td}|$. These equations are plotted in FIG. 7. Only two curves are shown for the inventive cell, whereas four are shown for the conventional cell, because the coupling between $V_d$ and the floating gate in the inventive cell is very small. Two additional curves are necessary to describe the conventional cell since the change in $V_d$ has a much greater effect on $\Delta V_{TunnOx}$. It is assumed that $V_d=0$ V when the cell is unselected and $V_d=2$ V when the cell is selected.

Figure 7:
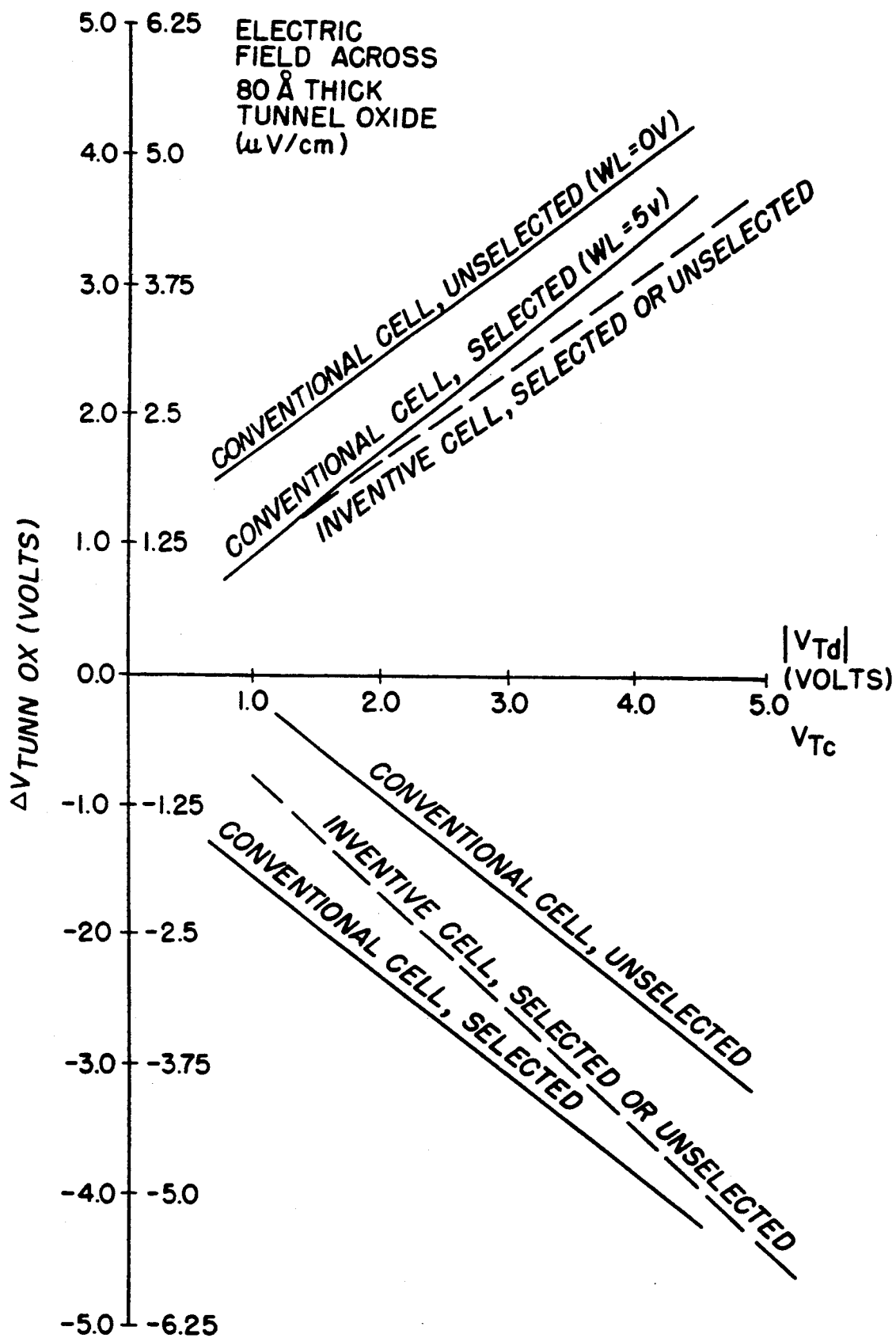
FIG. 7 is a plot useful for explaining the advantages of the cell of FIG. 4 over the cell of FIG. 1.

For the purpose of comparing two cell structures for data retention, it is necessary to compare the worst-case situation of each. FIG. 7 shows that for a discharged conventional cell, there is a stronger electric field across the tunnel dielectric if the cell is unselected than if it is selected. The unselected cell is therefore the worst case since electrons tunnel across the tunnel dielectric more freely. Similarly, for a charged conventional cell, the worst case occurs when the cell is selected.

It can be seen that the electric field across the tunnel dielectric is always significantly weaker in the inventive cell than it is under the worst-case conditions in the conventional cell. This is true for at least all $|V_T|$ above 1 volt, the lowest $|V_T|$ that can be expected during the life of the part. The inventive cell will therefore retain its programmed data for a longer period of time than the conventional cell operating under worst-case conditions.

Additionally, it has been found that in all floating gate cells using Fowler-Nordheim tunnelling, the values of $V_{Tc}$ and $V_{Td}$ tend to decay over the life of the device due to various phenomena which are mostly dependent on the magnitude of the electric field across the tunnel dielectric. The weaker electric field therefore also provides the additional advantage of reducing the rate of this decay. The manufacturer of a device incorporating the inventive cell may therefore specify a longer lifetime for the part. Alternatively, if the specified lifetime of the device is not increased, the $V_{Tc}/V_{Td}$ window will be larger than in the conventional cell at the end of the part's specified life. A larger end-of-life window permits greater design margin and greater tolerance to variations in tunnel dielectric thickness. It also results in a larger distribution of higher-speed parts, because of increased gain in the floating gate read transistor and reduced capacitance on the product term. FIG. 7 shows that even when the threshold voltages have decayed to $V_{Tc}=1.5$ V and $V_{Td}=-1$ V, which are typical end-of-life values for the conventional cell, the inventive cell still has a significantly smaller $\Delta V_{TunnOx}$ and tunnel dielectric electric field than the conventional cell in the worst case.

As previously mentioned, the voltage $V_{WDL}$ on the write data line of the inventive cell during sense mode may be a constant voltage other than $V_{cg}$. It can be seen that different values for $V_{WDL}$ have the effect of raising or lowering the dashed lines in FIG. 7. Thus, the inventive cell may be adapted for the particular needs of the manufacturer. For example, if some other mechanism is provided to prevent charge loss in a charged cell, or if charge loss from a charged cell is prevented inherently in the fabrication process, the chip design may be optimized to prevent charge gain in a discharged cell by selecting an appropriate $V_{WDL}$.

The invention has been described with respect to particular embodiments thereof. Numerous variations are possible as will be apparent to a person of ordinary skill after reading the present specification. For example, though all transistors shown or described herein are N-channel transistors in a P-type substrate, it will be understood that P-channel transistors in an N substrate may be used instead. As another example, though the inventive cell is shown herein as being used in an AND array of an EEPLD, it will be understood that it may also be used to accomplish programmability in the OR array or in other programmable components of the EEPLD such as an output logic macrocell. It may also be used for redundancy fuses, and in non-EEPLD devices including EEPROMs. As another example, though FIG. 6 shows a double poly construction of the inventive cell, the invention applies equally to other technologies including a single poly technology where the control gate of the tunnel capacitor is formed from a source drain diffusion. Additionally, though the write process has been described as a global charge followed by a selective discharge, the invention works equally well for any write process. For example, a global discharge followed by a selective charge will work, as will selective charge and discharge of individual cells. Moreover, whereas the above description uses $V_{WDL}$ to control the voltage of the tunnel capacitor drain, it will be understood that $V_{WDL}$ may instead be kept at a high voltage and $V_{WSL}$ varied appropriately. The voltage of the tunnel capacitor drain is then $V_{WSL}-V_T$. All these variations and others are intended to be within the scope of the present invention as defined by the claims.

We claim:

1. A non-volatile memory apparatus including a plurality of memory cells, each memory cell including a floating gate tunnel device (130) having a drain (134) and a floating gate read transistor (140) having a source (142) and a drain (144), the tunnel device and read transistor in each respective cell having a common floating gate (138, 148) and a common control gate (136, 146), said apparatus comprising:

writing means (102, 160) for writing desired charge levels to the floating gate of a cell to be written during a writing operation;

sense means (140, 150) for sensing the charge levels on the floating gate of a cell to be read during a sense operation; and means for applying during said sense operation a predetermined reference voltage to the source of the read transistor in said cell to be read, and a predetermined sense mode drain voltage different from said reference voltage to the drain of the tunnel device in said cell to be read, independently of the voltage at the drain of the read transistor in said cell to be read.

2. An apparatus according to claim 1, for use with a write select signal and a read select signal, said apparatus further comprising a write data line (WDL), wherein said writing means comprises:

means (102, CGL) for supplying desired writing potentials to the control gate in said cell to be written and to said write data line during said writing operation; and means (102, 160) for selectively coupling the potential on said write data line to the drain of the tunnel device in said cell to be written during said writing operation in response to said write select signal, and wherein said means for applying comprises:

means (102) for supplying said sense mode drain voltage to said write data line during said sense operation independently of the state of said read select signal; and means (160) for coupling the potential on said write data line to the drain of the tunnel device in said cell to be read during said sense operation independently of the state of said read select signal.

3. An apparatus according to claim 1, further comprising means for applying said sense mode drain voltage to the control gate in said cell to be read during said sense operation, and wherein said sense mode drain voltage is between the charged and discharged threshold voltages of the floating gate read transistor in said cell to be read.

4. An apparatus according to claim 3, wherein the floating gate read transistor in said cell to be read is substantially an intrinsic transistor.

5. An apparatus according to claim 1, for use with a read select signal having active and inactive states, wherein said sense means comprises means (150) for sensing the charge level on the floating gate in said cell to be read during said sense operation only if said read select signal is active, the drain of said tunnel device in said cell to be read being maintained at said sense mode drain voltage during said sense operation independently of the state of said read select signal.

6. An apparatus according to claim 5, for use further with a write select signal, said write select signal being distinct from said read select signal, said apparatus further comprising a write data line (WDL), wherein said writing means comprises:

means (102, CGL) for supplying desired write potentials to the control gate in said cell to be written and to said write data line during said writing operation; and means (102, 160) for selectively coupling the potential on said write data line to the drain of the tunnel device in said cell to be written during said writing operation in response to said write select signal, and wherein said means for applying comprises:

means (102) for supplying said sense mode drain voltage to said write data line during said sense operation independently of the state of said read select signal; and means (160) for coupling the potential on said write data line to the drain of the tunnel device in said cell to be read during said sense operation independently of the state of said read select signal.

7. An apparatus according to claim 6, further comprising means for applying said sense mode drain voltage to the control gate in said cell to be read during said sense operation, and wherein said sense mode drain voltage is between the charged and discharged threshold voltages of the floating gate read transistor in said cell to be read.

8. A non-volatile memory apparatus comprising:

an array of memory cells, each having a floating gate tunnel device and a floating gate read transistor, said tunnel devices and read transistors each having a drain, said read transistors each further having a source, the tunnel device and read transistor in each of said cells sharing a common control gate and a common floating gate; and sensing means for sensing whether selected ones of the floating gate read transistors are charged, said sensing means including circuitry applying a non-zero sense mode drain voltage to the drain of the tunnel devices in all of said cells and circuitry applying said sense mode drain voltage to the control gates of all of said cells, said sense mode drain voltage being between the charged and discharged threshold voltages of the floating gate read transistor in all of said cells.

9. An apparatus according to claim 8, wherein each given one of said cells further comprises:

a read select transistor having a source, a drain and a select gate, said source of said read select transistor being coupled to the drain of the floating gate read transistor in said given cell; and a write select transistor having a drain, a source and a select gate, said source of said write select transistor being coupled to the drain of the tunnel device in said given cell, said apparatus further comprising control circuitry having a read select output coupled to the select gates of all the read select transistors in a first subset of said cells, a write select output coupled to the select gates of all the write select transistors in said first subset of cells, a write data output coupled to the drains of all the write select transistors in a second subset of said cells and a control gate output coupled to all the control gates in said second subset of cells, the intersection of said first and second subsets defining exactly one of said cells, said control circuitry operating in at least a sense mode and a write mode, said control circuitry when operating in said write mode providing a write select signal at said write select output and providing a writing potential difference between said control gate output and said write data output in order to selectively charge or discharge the floating gate in said exactly one cell if said write select signal is active, and said control circuitry when operating in said sense mode providing a read select signal at said read select output, said sense mode drain voltage at both said write data output and said control gate output, and a potential at said write select output sufficient such that the potential of the drain of the tunnel device in said exactly one cell is substantially equal to the potential of the drain of the write select transistor in said exactly one cell.

10. An apparatus according to claim 9, wherein said control gate output is coupled to all the control gates in all of said cells.

11. A method of sensing the charge level on a common floating gate in a memory cell, said memory cell including a floating gate tunnel device and a floating gate read transistor, said tunnel device and read transistor each having a drain, said read transistor further having a source, said tunnel device and read transistor sharing a common control gate and said common floating gate, said floating gate read transistor having charged and discharged threshold voltages $V_{Tc}$ and $V_{Td}$, respectively, said method comprising the steps of:

applying a substantially non-zero sense mode drain voltage to said drain of said tunnel device, said sense mode drain voltage being between $V_{Tc}$ and $V_{Td}$;

applying a bias voltage to said drain of said floating gate read transistor and a reference voltage to said source of said floating gate read transistor;

applying a control gate voltage $V_{cg}$ to said control gate, $V_{cg}$ being substantially equal to said sense mode drain voltage; and observing the resulting voltage on said drain of said floating gate read transistor while continuing to apply said sense mode drain voltage to said drain of said floating gate tunnel device.

* * * * *